(12) United States Patent
Yoshinaga

(10) Patent No.: US 6,433,727 B1
(45) Date of Patent: Aug. 13, 2002

(54) AD CONVERTER WITH A POWER SAVING CIRCUIT AND ITS CONTROL METHOD

(75) Inventor: Chikashi Yoshinaga, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/476,138

(22) Filed: Jan. 3, 2000

(30) Foreign Application Priority Data

Jan. 8, 1999 (JP) ............................................. 11-002828

(51) Int. Cl.[7] ................................................. H03M 1/12
(52) U.S. Cl. ........................ 341/172; 341/155; 341/156
(58) Field of Search ................................. 341/172, 120, 341/156, 118, 116, 155, 154, 158, 153, 161

(56) References Cited

U.S. PATENT DOCUMENTS

| | | | | |
|---|---|---|---|---|
| 4,200,863 A | * | 4/1980 | Hodges et al. ......... | 340/347 AD |
| 4,803,462 A | * | 2/1989 | Hester et al. ............... | 341/172 |
| 4,831,381 A | * | 5/1989 | Hester ........................ | 341/172 |
| 5,576,708 A | * | 11/1996 | De Wit ....................... | 341/118 |
| 5,581,252 A | * | 12/1996 | Thomas ...................... | 341/144 |
| 5,684,487 A | * | 11/1997 | Timko ........................ | 341/172 |

FOREIGN PATENT DOCUMENTS

JP         64-13818         1/1989

* cited by examiner

*Primary Examiner*—Brian Young
*Assistant Examiner*—John Nguyen
(74) *Attorney, Agent, or Firm*—Whitham, Curtis & Christofferson

(57) ABSTRACT

The present invention provides an AD converter in which a first capacitor array is connected to one input of a comparator and a second capacitor array is connected to another input of the comparator and in which a charge proportional to an input analog signal level VAIN is accumulated in the first capacitor array. The AD converter comprises a level-adjusting capacitor whose one end is connected to the one input of the comparator to adjust a voltage of the one input of the comparator, to which the first capacitor array is connected, to a predetermined voltage; and switching means for switching a potential of another end of the capacitor to the potential that differs between a sampling mode and a comparison mode.

10 Claims, 9 Drawing Sheets

AD CONVERTER WITH A POWER SAVING CIRCUIT AND ITS CONTROL METHOD

BACKGROUND OF THE INVENTION

1. Field of the Invention

The present invention relates to an AD converter and its control method and, and more particularly to an AD converter with a power saving circuit and its control method.

2. Description of the Related Art

FIG. 5 shows an example of the configuration of a conventional AD converter with sampling capacitors.

An AD converter 501 comprises an analog input side capacitor array 502, a reference side capacitor array 503, a comparator 504, and a successive approximation control circuit 505. The analog input side capacitor array 502 is an array composed of 4-bit-weighted capacitors 508, 509, 510, 511, and 512. That is, the capacitors 508 and 509 are capacitors with the reference capacity value of C, the capacity 510 is a capacitor with the capacity value of 2C, the capacity 511 is a capacitor with the capacity value of 4C, and the capacity 512 is a capacitor with the capacity value of 8C. The one end of each of the above capacitors is connected to a selector 518, 519, 520, 521, or 522, respectively and, in response to a control signal 534 from the successive approximation control circuit 505, is connected to an analog input terminal 536, a reference power source terminal 537, or a ground terminal 538.

The reference side capacitor array 503 is also an array composed of 4-bit-weighted capacitors 513, 514, 515, 516, and 517. That is, the capacitors 513 and 514 are capacitors with the reference capacity value of C, the capacity 515 is a capacitor with the capacity value of 2C, the capacity 516 is a capacitor with the capacity value of 4C, and the capacity 517 is a capacitor with the capacity value of 8C. The one end of each of the above capacitors is connected to a selector 523, 524, 525, 526, or 527, respectively and, in response to the control signal 534 from the successive approximation control circuit 505, is connected to a ground terminal 539.

The comparator 504 comprises an output-stage amplifier 543 and a pre-amplifier 542 that reduces the offset of the output-stage amplifier 543. The output-stage amplifier 543 and the pre-amplifier 542 are connected via offset-canceling capacitors 545 and 546. Analog switch 547 and 548, provided for determining the operation point of the output-stage amplifier 543 and for canceling the offset of the pre-amplifier 542, are turned on during offset canceling.

Switches 530 and 531 are switches used to fix the potential of a common electrodes 532 of the analog input side capacitor array 502 and a common electrode 533 of the reference side capacitor array 503, respectively, to the intermediate potential 541 output from a bias circuit 540 when sampling the analog input voltage.

Next, the AD conversion operation of the conventional AD converter shown in FIG. 5 will be described.

First, in the sampling mode, switches 530 and 531 are turned on. Then, the common electrode 532 of the analog input side capacitor array 502 and the common electrode 533 of the reference side capacitor array 503 are connected to the intermediate potential 541 output from the bias circuit 540. The capacitors 508–512 are connected to the analog input voltage VAIN by the selectors 518–522. The capacitors 513–517 are connected to the ground potential GND by the selectors 523–527. Turning the switches 547 and 548 on sets inputs 549 and 550 of the output-stage amplifier 543 to the intermediate potential 541 output from the bias circuit 540 and, at the same time, stores the output offset of the pre-amplifier 542 in the offset-canceling capacitors 545 and 546. At this time, let VS be the intermediate potential 541 output from the bias circuit 540. Then, the total charge Q13 accumulated in the analog input side capacitor array 502 is calculated as:

$$Q13=16C\times(VAIN-VS) \qquad (25)$$

The total charge Q14 accumulated in the reference side capacitor array 503 is calculated as:

$$Q14=16C\times(-VS) \qquad (26)$$

Next, when the mode is changed to the comparison mode, switches 530 and 531 are turned off. Then, the capacitors 508–511 are connected to the ground potential GND by selectors 518–521. The capacitor 512 is connected to the reference potential VR by the selector 522. The capacitors 513–517 are connected to the ground potential GND by the selectors 523–527. At this time, let VCM1 be the potential of the common electrode 532. Then, the total charge Q15 accumulated in the analog input side capacitor array 502 is calculated as:

$$Q15=8C\times(VR-VCM1)-8C\times VCM1 \qquad (27)$$

Let VCM2 be the potential of the common electrode 533. Then, the total charge Q16 accumulated in the reference side capacitor array 503 is calculated as:

$$Q16=16C\times(-VCM2) \qquad (28)$$

Here, $$Q13=Q15 \qquad (29)$$

$$Q14=Q16 \qquad (30)$$

by the law of charge conservation. The following is obtained by substituting equations (25)–(28) into equations (29) and (30):

$$VCM1=\tfrac{1}{2}\times VR-VAIN+VS \qquad (31)$$

$$VCM2=VS \qquad (32)$$

The comparator 504 outputs the comparison result of "1" or "0" by comparing the potential VCM1 of the common electrode 532 represented by equation (31) with the potential VCM2 of the common electrode 533 represented by equation (32). As equations (31) and (32) show, when the analog input voltage VAIN equals the output voltage of the analog input side capacitor array (here, ½×VR), both the potentials VCM1 and VCM2 of the comparator side electrodes become VS as if the offset of the pre-amplifier 542 was canceled. The output offset of the pre-amplifier 542, generated when the potential of the common electrodes 532 and 533 which are the inputs to the pre-amplifier 542 is VS, is accumulated in the offset-canceling capacitors 545 and 546. Therefore, the potential of the inputs 549 and 550 of the output-stage amplifier 543 also become VS, and therefore the output offset of the pre-amplifier 542 may be ignored. The input offset of the output-stage amplifier 543 is reduced to a value generated by dividing it by the amplification ratio of the pre-amplifier 542.

The successive approximation control circuit 505 determines the value of the most significant bit of the conversion result based on the output from the comparator 504, and supplies the control signal 534 to the selectors 518–522 to perform the comparison operation corresponding to the bit in the next place.

If the analog input voltage VAIN is higher than ½×VR, the comparator 504 outputs "1" to output the control signal 534 to connect the capacitor 511, corresponding to the bit in the next place, to the reference voltage VR while the capacitor 512, corresponding to the most-significant bit, is still connected to the reference voltage VR. That is, in the second comparison, the analog input voltage VAIN is compared with ¾×VR. Conversely, if the analog input voltage VAIN is lower than ½×VR, the comparator 504 outputs "0" to output the control signal 534 to connect the capacitor 512, corresponding to the most significant bit, to the ground potential GND and to connect the capacitor 511, corresponding to the bit in the next place, to the reference voltage VR. In the second comparison, the analog input voltage VAIN is compared with ¼×VR. In this way, by repeating the operation in which the successive approximation control circuit 505 outputs the successive approximation control signal 534 and then determines the bit value based on the output of the comparator 504 for a specified number of times (four times in this example), the analog input voltage VAIN is converted to digital output signals 535.

However, this prior art has the following problems:

The first problem is that the output voltage of the bias circuit has some limitations. The following describes the reason. To perform the normal AD conversion operation in the AD converter described above, it is necessary to conserve the charge of the common electrode 532 in the comparison mode. In this case, if the input impedance is extremely high as in the comparator where an MOS transistor is used in the input stage, there is no problem. However, there is a charge leak problem caused by the switch 530 connected to the common electrode 532. Now, consider a CMOS analog switch in which an N-channel transistor 601 and a P-channel transistor 602 are connected in parallel and complementary switch control signals 603 and 604 are sent to the gates, as shown in FIG. 6.

FIG. 7 shows an equivalent circuit of the CMOS analog switch shown in FIG. 6.

As shown in FIG. 7, the CMOS analog switch has parasitic diodes. Diodes 703 and 704 are parasitic diodes between the drain/source diffusion layer and the P-well or P-substrate of the N-channel transistor 601. Because the P-well or P-substrate is normally at the ground potential GND, the ground potential GND is connected to one end of each of the diodes 703 and 704. Diodes 701 and 702 are parasitic diodes between the drain/source diffusion layer and the N-well or N-substrate of the P-channel transistor 602. Because the N-well or N-substrate is normally at the power source potential VDD, the power source potential VDD is connected to one end of each of the diodes 701 and 702. In addition, a resistor 709 is an equivalent resistor when the switch is turned on, capacitors 705 and 706 are a parasitic capacity between the gate and the source, and a parasitic capacity between the gate and the drain, of the P-channel transistor 602, and capacitors 707 and 708 are a parasitic capacity between the gate and the source, and a parasitic capacity between the gate and the drain, of the N-channel transistor 601.

The potential VCM1 of the common electrode 532 is represented by equation (31) when the AD converter 501 is in the comparison mode of the most significant bit. Therefore, when the analog input voltage VAIN is near the power source potential or the ground potential, the potential VCM1 of the common electrode 532 is sometimes higher than the power source potential or lower than the ground potential. When the potential VCM1 of the common electrode 532 is out of the power source voltage range, one of the parasitic diodes 701–704 in the switch 530 conducts and the charge accumulated in the common electrode 532 leaks through the conducting diode, preventing the normal AD conversion operation. To prevent this, it is found that, from equation (31), $$VS = \tfrac{1}{2} \times VDD \qquad (33)$$

is necessary. As described above, the conventional AD converter imposes limitations on the output voltage of the bias circuit.

The second problem is that the low-voltage operation is difficult.

The reason is that the ON resistance of the CMOS analog switch is very high when conducting at a voltage near ½×VDD. This condition becomes more significant as the voltage is decreased. FIG. 8 shows how the ON resistance of the ON resistor 709 of the CMOS analog switch depends on the voltage. FIG. 8(a) shows the ON resistance when the power source voltage is high, while FIG. 8(b) shows the ON resistance when the power source voltage is low. As shown in FIG. 8, the ON resistance of the CMOS analog switch is high when conducting at a voltage near ½×VDD and this condition becomes more significant as the power source voltage is decreased. As is pointed out in the first problem, because the output voltage VS of the bias circuit 540 must be ½×VDD, the switch 530 must be used in a condition in which the ON resistance is very high. In the sampling mode, the time required from the moment the switch 530 is turned on to the moment the potential VCM1 of the common electrode 532 becomes equal to the output voltage VS of the bias circuit 540 depends on the time constant of the total capacity of the capacitor array 502, the ON resistance of the switch 530, and the total resistance of the output resistance of the bias circuit 540. Therefore, when the ON resistance of the switch 530 is very high, the sampling mode operation becomes very long. As a result, the AD conversion time becomes too long to be practical.

The third problem is that the low-power operation is difficult.

The reason is that the conventional AD converter requires a bias source. As is pointed out in the second problem, the sampling mode time depends on the time constant of the total capacity of the capacitor array 502, the ON resistance of the switch 530, and the total resistance of the output resistance of the bias circuit 540. Therefore, to reduce the time required for the sampling mode in order to speed up AD conversion, the output resistance of the bias circuit 540 must be decreased. To decrease the output resistance of the bias circuit 540 is to increase the current supply ability of the bias circuit 540. This will result in an increase in the power consumption of the bias circuit 540.

In addition, when the comparator is configured such that the pre-amplifier 542 is provided before, and connected to, the output-stage amplifier 543 via capacitors in order to reduce the offset of the comparator 504, a bias source that biases the potential of the offset-canceling capacitors 545 and 546 to the intermediate potential is necessary. Because the output of the pre-amplifier 542 is connected to the other terminal sides of the offset-canceling capacitors, applying the bias to the offset-canceling capacitors with the power source potential causes the output of the pre-amplifier 542 to increase (or decrease) the potential of the inputs 549 and 550 of the output-stage amplifier 543 too much to get out of the power source voltage range. This causes one of the parasitic diodes to conduct and causes the charge accumulated in the offset-canceling capacitors 545 and 546 to leak through the conducting diode, thus preventing the normal AD conversion operation from being executed.

Japanese Patent Laid-Open Publication No. Hei 1-13818 discloses an AD converter which prevents a charge leak from the CMOS analog switch in order to execute the normal AD conversion operation. FIG. 9 shows the AD converter disclosed in Japanese Patent Laid-Open Publication No. Hei 1-13818. An AD converter 901 comprises an analog input side capacitor array 902, a reference side capacitor array 903, a comparator 904, and a successive approximation control circuit 905. The analog input side capacitor array 902 is an array composed of 4-bit-weighted capacitors 908, 909, 910, 911, and 912. That is, the capacitors 908 and 909 are capacitors with the reference capacity value of C, the capacity 910 is a capacitor with the capacity value of 2C, the capacity 911 is a capacitor with the capacity value of 4C, and the capacity 912 is a capacitor with the capacity value of 8C. The one end of each of the above capacitors is connected to a selector 918, 919, 920, 921, or 922, respectively and, in response to a control signal 934 from the successive approximation control circuit 905, is connected to an analog input terminal 936, a reference power source terminal 937, or a ground terminal 938.

The reference side capacitor array 903 is also an array composed of 4-bit-weighted capacitors 913, 914, 915, 916, and 917. That is, the capacitors 913 and 914 are capacitors with the reference capacity value of C, the capacity 915 is a capacitor with the capacity value of 2C, the capacity 916 is a capacitor with the capacity value of 4C, and the capacity 917 is a capacitor with the capacity value of 8C. The one end of each of the above capacitors is connected to a selector 923, 924, 925, 926, or 927, respectively and, in response to the control signal 934 from the successive approximation control circuit 905, is connected to a ground terminal 939 via the above selector.

Switches 930 and 931 set the potential of a common electrodes 932 of the analog input side capacitor array 902 and a common electrode 933 of the reference side capacitor array 903, respectively, to the intermediate potential 941 output from a bias circuit 940 when sampling the analog input voltage.

The AD converter shown in FIG. 9 differs from the AD converter shown in FIG. 5 in that capacitors 906 and 907, each with the capacity value of 8C that is equal to the capacity value of the most significant bit, are added to the capacitor arrays 902 and 903, respectively. The one end of each of the capacitors 906 and 907 is fixed to ground terminals 938 and 939, respectively.

Next, the AD conversion operation of the AD converter disclosed in Japanese Patent Laid-Open Publication No. Hei 1-13818 and shown in FIG. 9 will be described.

First, in the sampling mode, switches 930 and 931 are turned on. Then, the common electrode 932 of the analog input side capacitor array 902 and the common electrode 933 of the reference side capacitor array 903 are connected to the intermediate potential 941 output from the bias circuit 940. The capacitors 908–912 are connected to the analog input voltage VAIN by the selectors 918–922. The capacitors 913–917 are connected to the ground potential GND by the selectors 923–927. At this time, let VS be the intermediate electric potential 941 output from the 940. Then, the total charge Q17 accumulated in the analog input side capacitor array 902 is calculated as:

$$Q17 = 16C \times (VAIN - VS) - 8C \times VS \tag{34}$$

The total charge Q18 accumulated in the reference side capacitor array 903 is calculated as:

$$Q18 = 24C \times (-VS) \tag{35}$$

Next, when the mode is changed to the comparison mode, switches 930 and 931 are turned off. Then, the capacitors 908–911 are connected to the ground potential GND by selectors 918–921. The capacitor 912 is connected to the reference potential VR by the selector 922. The capacitors 913–917 are connected to the ground potential GND by the selectors 923–927. At this time, let VCM1 be the potential of the common electrode 932. Then, the total charge Q19 accumulated in the analog input side capacitor array 902 is calculated as:

$$Q19 = 8C \times (VR - VCM1) - 16C \times VCM1 \tag{36}$$

Let VCM2 be the potential of the common electrode 933. Then, the total charge Q20 accumulated in the reference side capacitor array 903 is calculated as:

$$Q20 = 24C \times (-VCM2) \tag{37}$$

Here, $$Q17 = Q19 \tag{38}$$

$$Q18 = Q20 \tag{39}$$

by the law of charge conservation. The following is obtained by substituting equations (34)–(37) into equations (38) and (39):

$$VCM1 = \tfrac{2}{3} \times (\tfrac{1}{2} \times VR - VAIN) + VS \tag{40}$$

$$VCM2 = VS \tag{41}$$

The comparator 904 outputs the comparison result of "1" or "0" by comparing the potential VCM1 of the common electrode 932 represented by equation (40) with the potential VCM2 of the common electrode 933 represented by equation (41). The successive approximation control circuit 905 determines the value of the most significant bit of the conversion result based on the output from the above comparator 904, and supplies the control signal 934 to the selectors 918–922 to perform the comparison operation on the bit corresponding to the next place. In this way, by repeating the operation in which the successive approximation control circuit 905 outputs the successive approximation control signal 934 and then determines the bit value based on the output of the comparator 904 for a specified number of times (four times in this example), the analog input voltage VAIN is converted to an output signal 935.

However, this prior art has the following problems:

The first problem is that the output voltage of the bias circuit has some limitations. The following describes the reason. To perform the normal AD conversion operation in the AD converter described above, it is necessary to conserve the charge of the common electrode 932 in the comparison mode. In this case, if the input impedance is extremely high as in the comparator where an MOS transistor is used in the input stage, there is no problem. However, there is a charge leak problem caused by the switch 930 connected to the common electrode 932. Now, consider a CMOS analog switch in which an N-channel transistor 601 and a P-channel transistor 602 are connected in parallel and complementary switch control signals 603 and 604 are sent to the gates, as shown in FIG. 6.

As with the conventional AD converter, the potential VCM1 of the common electrode 932 is represented by equation (40) when the AD converter 901 is in the comparison mode of the most significant bit. Therefore, when the analog input voltage VAIN is near the power source potential or the ground potential, the potential VCM1 of the common electrode 932 is sometimes higher than the power source potential or lower than the ground potential.

When the potential VCM1 of the common electrode 932 is out of the power source voltage range, one of the parasitic diodes 701–704 in the switch 930 conducts and the charge accumulated in the common electrode 932 leaks through the conducting diode, preventing the normal AD conversion operation.

To prevent this, it is found that, from equation (40), $$VS = \tfrac{1}{3} \times VDD \text{ to } \tfrac{2}{3} \times VDD \tag{42}$$

is necessary.

As described above, the conventional AD converter imposes limitations on the output voltage of the bias circuit.

The second problem is that the low-voltage operation is difficult.

The reason is that, as with the conventional AD converter, the ON resistance of the CMOS analog switch is very high when conducting at a voltage near ½×VDD. This condition becomes more significant as the voltage is decreased. As shown in FIG. 8, the ON resistance of the CMOS analog switch is high when conducting at a voltage near ½×VDD and this condition becomes more significant as the power source voltage is decreased. As is pointed out in the first problem, because the output voltage VS of the bias circuit 940 must be ⅓×VDD to ⅔×VDD, the switch 930 must be used in a condition in which the ON resistance is very high. In the sampling mode, the time from the moment the switch 930 is turned on to the moment the potential VCM1 becomes equal to the output voltage VS of the bias circuit 940 depends on the total capacity of the capacitor array 902 and on the time constant of the ON resistance of the switch 930 and the total resistance of the output resistance of the bias circuit 940. Therefore, when the ON resistance of the switch 930 is very high, the sampling mode operation becomes very long. As a result, the AD conversion time becomes too long to be practical.

The third problem is that the low-power operation is difficult.

The reason is that, as with the conventional AD converter, this AD converter also requires a bias source. As is pointed out in the second problem, the sampling mode time depends on the total capacity of the capacitor array 902 and on the time constant of the ON resistance of the switch 930 and the total resistance of the output resistance of the bias circuit 940. Therefore, to reduce the time required for the sampling mode in order to speed up AD conversion, the output resistance of the bias circuit 940 must be decreased. To decrease the output resistance of the bias circuit 940 is to increase the current supply ability of the bias circuit 940. This will result in an increase in the power consumption of the bias circuit 940.

FIG. 10 shows an example of the conventional comparator in which amplifiers are connected via a plurality of capacitors to cancel the offset of the comparator and the input potentials of the amplifiers are set equal during offset cancel operation. A comparator 1001 comprises an output-stage amplifier 1003 and a pre-amplifier 1002 which reduces the offset of the output-stage amplifier 1003. The output-stage amplifier 1003 and the pre-amplifier 1002 are connected via offset-canceling capacitors 1004 and 1005. Analog switches 1012 and 1013, which are provided to set the operation point of the output-stage amplifier 1003 equal to the operation point of the pre-amplifier 1002 and to cancel the offset of the pre-amplifier 1002, are turned on during the offset cancel operation. Analog switches 1015 and 1016 are connected to two inputs 1006 and 1007 of the comparator 1001. An offset canceling bias source 1014 is connected to other side of the analog switches 1015 and 1016.

Next, the operation of the comparator shown in FIG. 10 will be described.

During the offset cancel operation, the analog switches 1015 and 1016 are turned on and the two inputs, 1006 and 1007, of the comparator 1001 are set to an output potential 1017 from the bias source 1014. In addition, the offset canceling switches 1012 and 1013 are turned on, inputs 1010 and 1011 of the output-stage amplifier 1003 are also set to the output potential 1017 of the bias source 1014 and, at the same time, the output offset of the pre-amplifier 1002 is stored in the offset-canceling capacitor 1004 and 1005. During the comparison operation, the offset canceling switches 1012 and 1013 and the analog switches 1015 and 1016 are turned off, the potentials of the two inputs, 1006 and 1007, of the comparator 1001 are compared, and the comparison result 1018 is output. If the potentials of the two inputs, 1006 and 1007, are equal, the output offset of the pre-amplifier 1002 is stored in the offset-canceling capacitors 1004 and 1005. Therefore, the potentials of the inputs 1012 and 1013 of the output-stage amplifier 1003 become equal to the output potential 1017 from the bias source 1014 and therefore the output offset of the pre-amplifier 1002 maybe ignored. The input offset of the output-stage amplifier 1003 is reduced to a value generated by dividing it by the amplification ratio of the pre-amplifier 1002.

However, this prior art has the problems described below.

The first problem is that, when the components of the comparator are arranged close to each other in order to increase the compactor integration density, there is a possibility that the comparator operation will become unstable.

The reason for this will be described below.

In general, to reduce the production cost, a semiconductor integrated circuit is laid out as dense as possible to increase its integration. FIG. 11 schematically shows an example of the layout of the comparator, shown in FIG. 10, including the pre-amplifier 1002, output-stage amplifier 1003, offset canceling capacitor 1005, and offset canceling switch 1013.

To increase the integration, the pre-amplifier 1002, output-stage amplifier 1003, offset canceling capacitor 1005, and offset canceling switch 1013 are arranged close to each other, as shown in FIG. 11. When they are arranged as shown in FIG. 11, the bottom electrode of the offset canceling capacitor 1005 connected to the output 1009 of the pre-amplifier 1002 is placed inevitably near the input 1007 of the comparator 1001 connected to the offset canceling switch 1013. In this state, there is a parasitic capacity 1101 between the input 1007 and the output 1009 of the pre-amplifier 1002 to such a degree that cannot be ignored and, this parasitic capacity 1101 provides the feedback to the pre-amplifier 1002. This feedback sometimes makes the operation of the pre-amplifier 1002 unstable during comparison operation or causes an oscillation. Arranging the components of the comparator close to each other to increase the integration density develops a problem of unstable comparator operation.

SUMMARY OF THE INVENTION

It is an object of the present invention to provide an AD converter, as well as its control method, which removes the drawbacks of the prior art described above, reduces the power consumption of the bias source, and makes the high-speed operation possible at a low voltage.

It is anther object of the present invention to provide an AD converter, as well as its control method, which makes possible the stable operation without oscillation even when its components are laid out at a high integration density.

To achieve the above objects, an AD converter according to the present invention basically employs the technical configuration described below.

That is, a first mode of the AD converter according to the present invention is an AD converter in which a first capacitor array is connected to one input of a comparator and a second capacitor array is connected to another input of the comparator and in which a charge proportional to an input analog signal level is accumulated in the first capacitor array, the AD converter comprising:

a level-adjusting capacitor whose one end is connected to the one input of the comparator to adjust a voltage of the one input of the comparator, to which the first capacitor array is connected, to a predetermined voltage; and switching means for switching a potential of another end of the capacitor to the potential that differs between a sampling mode and a comparison mode.

A second mode is an AD converter in which, in an input signal sampling mode, a first reference capacitor in which a charge proportional to an input analog signal level is accumulated is connected to one input to a comparator and a second reference capacitor is connected to another input of the comparator and in which, in a comparison mode, a predetermined voltage is applied from a resistor array to the first reference capacitor, the AD converter comprising:

a level-adjusting capacitor whose one end is connected to the one input of the comparator to adjust a voltage of the one input of the comparator, to which the first reference capacitor is connected, to a predetermined voltage; and switching means for switching a potential of another end of the capacitor to the potential that differs between the sampling mode and the comparison mode.

A third mode is the AD converter wherein, in the input signal sampling mode, the switching means is switched to charge an potential of an input side of the comparator to a power source potential.

A fourth mode is the AD converter wherein the power source potential is a ground potential.

A fifth mode is the AD converter wherein the comparator comprises a plurality of amplifiers and capacitors connecting each two of the plurality of amplifiers, wherein at least two stages of switching elements are connected in series to make equal a bias potential of an amplifier in a first stage and the bias potential of each of the amplifiers in a second and following stages, and wherein, at least in the comparison mode, the potential of nodes between the switching elements connected in series is fixed to a predetermined potential.

A sixth mode is the AD converter wherein one of the switching elements makes the potential of the two inputs of the comparator equal to the bias potential of the plurality of amplifiers in the comparator.

A seventh mode is the AD converter wherein the switching means makes the potential of another end of the capacitor a power source potential to make the one input of the comparator a predetermined potential and to cancel an offset of the comparator at the potential.

A first mode of an AD converter control method according to the present invention is a control method in which a first capacitor array is connected to one input of a comparator and a second capacitor array is connected to another input of the comparator and in which a charge proportional to an input analog signal level is accumulated in the first capacitor array, the AD converter control method comprising the steps of:

providing a level-adjusting capacitor whose one end is connected to the one input of the comparator to adjust a voltage of the one input of the comparator, to which the first capacitor array is connected, to a predetermined voltage; and switching a potential of another end of the capacitor to the potential that differs between a sampling mode and a comparison mode.

A second mode is an AD converter control method in which, in an input signal sampling mode, a first reference capacitor in which a charge proportional to an input analog signal level is accumulated is connected to one input to a comparator and a second reference capacitor is connected to another input of the comparator and in which, in a comparison mode, a predetermined voltage is applied from a resistor array to the first reference capacitor, the AD converter control method comprising the steps of:

providing a level-adjusting capacitor whose one end is connected to the one input of the comparator to adjust a voltage of the one input of the comparator, to which the first reference capacitor is connected, to a predetermined voltage; and switching a potential of another end of the capacitor to the potential that differs between the sampling mode and the comparison mode.

A third mode is an AD converter control method wherein an offset of the comparator is canceled at a voltage generated by the level-adjusting capacitor.

DESCRIPTION OF THE PREFERRED EMBODIMENTS

An AD converter according to the present invention fixes the potential of the electrode on the input side of the comparator to the power source potential (power source potential or ground potential) when sampling the analog input voltage into the sampling capacitors. This reduces the ON resistance of the MOS analog switch, making it possible to perform a high-speed operation at a low voltage. In addition, level-adjusting capacitors are added to the sampling capacitors to perform capacity-voltage division. This configuration prevents an AD conversion failure generated due to a leak caused by the potential of the electrode on the input side of the comparator exceeding the power voltage range during comparison operation. Furthermore, the AD converter eliminates the need for the bias circuit that fixes the potential of the electrode on the input side of the comparator to an intermediate potential; at the same time, it uses the intermediate potential, generated by the capacity-voltage division performed by the added level-adjusting capacitors, as the voltage to cancel the offset of the comparator to eliminate the need for the bias circuit needed for canceling the offset of the comparator. Moreover, connecting the switches in series in two stages to cancel the offset of the comparator and connecting the nodes between the switches connected in series eliminate the difference among potentials caused as a result of capacity-voltage division due to variations in capacitor capacity values. During comparison operation, the nodes between the switches connected in series are fixed to the power source potential. This configuration prevents an unstable comparator operation and an oscillation caused by a feedback to the comparator generated by the parasitic capacity during comparison.

Figure 1:
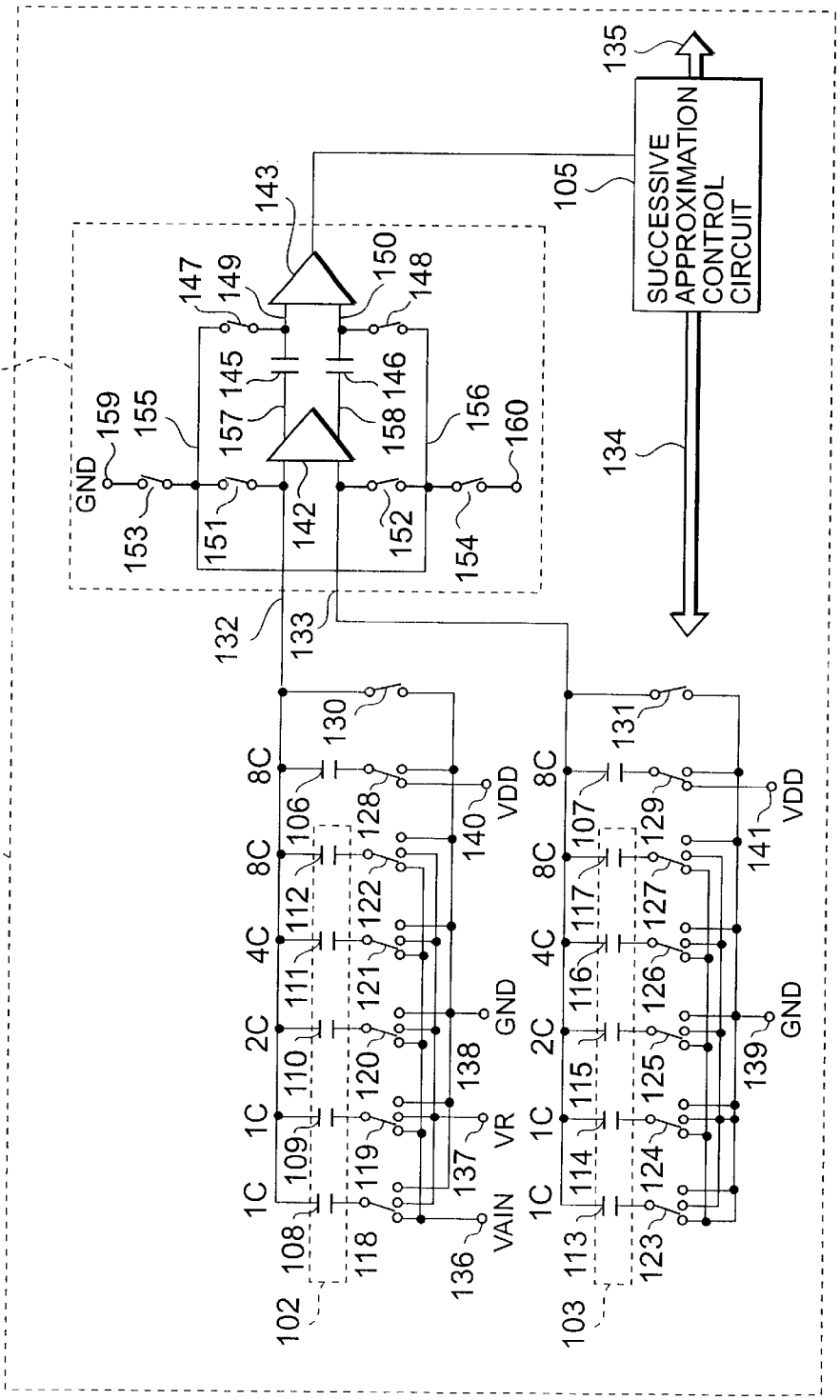
FIG. 1 is a circuit diagram of a first embodiment of an AD converter according to the present invention.

Referring to FIG. 1, when sampling the analog input voltage VAIN into an analog input side capacitor array 102, the analog input voltage VAIN is selected by selectors 118, 119, 120, 121, and 122 as the electrode on the analog input side of the analog input side capacitor array 102, a level-adjusting capacitor 106 is connected to a ground potential GND by a selector 128, and a common electrode 132 of the analog input side capacitor array 102 is set to the ground potential GND by a switch 130.

In a reference side capacitor array 103 connected to the other input of a comparator 104, the ground potential GND is selected by selectors 123, 124, 145, 126, and 127, a level-adjusting capacitor 107 is connected to the ground potential GND by a selector 129, and a common electrode 133 is set to the ground potential GND by a switch 131. Even when the switches 130 and 131 are MOS analog switches, their ON resistance is very low because the conduction potential is the ground potential GND, meaning that high-speed sampling is possible even at a low voltage.

Unlike the conventional AD converter in which the common electrodes 132 and 133 are set to the intermediate potential, such as the potential equal to ½ of the power source potential, the AD converter according to present invention does not require a bias source that generates the intermediate potential. Instead, by switching the potential of the level-adjusting capacitors 106 and 107 from the ground potential GND to the power source potential VDD by the selectors 128 and 129 during the comparison operation, capacity-voltage division is performed by the added level-adjusting capacitors 106 and 107 even when the voltage range of the analog input voltage VAIN is equal to the power voltage range. This prevents an incorrect conversion result caused by a leak from the switches 130 and 131 which is caused by the potential of the common electrodes 132 and 133 exceeding the power source voltage range during comparison operation.

Also, in a circuit in which amplifiers are connected via a plurality of capacitors to cancel the offset of the comparator, the offset-canceling intermediate voltage may be generated through capacity-voltage division by switching the potential of the level-adjusting capacitors 106 and 107 from the ground potential GND to the power source potential VDD by selectors 128 and 129. Therefore, the bias source for generating the offset-canceling intermediate potential is not necessary.

For the offset-canceling switches of the comparator, switches 147 and 151 are connected in series and, similarly, switches 148 and 152 are connected in series. During comparison operation, nodes 155 and 156 between the switches connected in series are set to the ground potential GND by the switches 153 and 154. This configuration prevents an unstable operation and an oscillation caused by a feedback to a pre-amplifier 142 through the parasitic capacity generated between the common electrodes 132, 133, which are inputs to the pre-amplifier 142, and the outputs 157, 158 of the pre-amplifier 142.

In addition, by connecting the nodes 155 and 156 which are located between the offset-canceling switches connected in series, the potentials of the common electrodes 132 and 133 which are inputs to the comparator may be set equally and the offset of the comparator may be canceled correctly even when the analog input side capacitor array 102, reference side capacitor array 103, and level-adjusting capacitors 106 and 107 vary in the capacity value and therefore there are variations in the intermediate potentials generated by performing capacity-voltage division for each capacitor array.

EXAMPLES

Some embodiments of an AD converter and its control method according to the present invention will be described in detail by referring to the attached drawings.

First Embodiment

FIG. 1 is a diagram showing the configuration an embodiment of the AD converter and its control method according to the present invention.

Referring to FIG. 1, there is provided an AD converter in which a first capacitor array 102 is connected to one input 132 of a comparator 104 and a second capacitor array 103 is connected to another input 133 of the comparator 104 and in which a charge proportional to an input analog signal level VAIN is accumulated in the first capacitor array 102. The AD converter comprises a level-adjusting capacitor 106 whose one end is connected to the one input 132 of the comparator 104 to adjust a voltage of the one input 132 of the comparator 104, to which the first capacitor array 102 is connected, to a predetermined voltage; and switching means 128 for switching a potential of another end of the capacitor 106 to the potential that differs between a sampling mode and a comparison mode.

The present invention will be described more in detail.

FIG. 1 shows a 4-bit successive approximation AD converter used in the first embodiment of the present invention.

An AD converter 101 comprises the analog input side capacitor array 102, reference side capacitor array 103, comparator 104, a successive approximation control circuit 105, analog input side level-adjusting capacitor 106, and reference side level-adjusting capacitor 107.

The analog input side capacitor array 102 is an array composed of 4-bit-weighted capacitors 108, 109, 110, 111, and 112. That is, capacitors 108 and 109 are capacitors with the reference capacity value of C, the capacity 110 is a capacitor with the capacity value of 2C, the capacity 111 is a capacitor with the capacity value of 4C, and the capacity 112 is a capacitor with the capacity value of 8C. The one end of each of the above capacitors is connected to a selector 118, 119, 120, 121, or 122, respectively and, in response to a control signal 134 from the successive approximation control circuit 105, is connected to an analog input terminal 136, a reference power source terminal 137, or a ground terminal 138. The reference power terminal 137 is the terminal of the power that is used as the reference when the analog input voltage VAIN is converted to digital values. In general, the voltage range of the reference power source is equal to or smaller than that of the power source voltage.

The reference side capacitor array 103 is also an array composed of 4-bit-weighted capacitors 113, 114, 115, 116, and 117. That is, the capacitors 113 and 114 are capacitors with the reference capacity value of C, the capacity 115 is a capacitor with the capacity value of 2C, the capacity 116 is a capacitor with the capacity value of 4C, and the capacity 117 is a capacitor with the capacity value of 8C. The one end of each of the above capacitors is connected to a selector 123, 124, 125, 126, or 127, respectively and, in response to the control signal 134 from the successive approximation control circuit 105, is connected to a ground terminal 139 via the selectors 123, 124, 125, 126, and 127.

The comparator 104 comprises an output-stage amplifier 143 and a pre-amplifier 142 that reduces the offset of the output-stage amplifier 143. The output-stage amplifier 143 and the pre-amplifier 142 are connected via offset-canceling capacitors 145 and 146. Analog switch 147, 148, 151, and 152, provided for determining the operation point of the output-stage amplifier 143 and for canceling the offset of the pre-amplifier 142, are turned on during offset canceling.

The common electrode 132 of the pre-amplifier 142 may be connected to the node 155 via the analog switch 151. Similarly, the common electrode 133 of the pre-amplifier 142 may be connected to the node 156 via the analog switch 152. The node 155 between the analog switches 147 and 151 and the node 156 between the analog switches 148 and 152 are connected. These nodes are connected to switches 153 and 154 which are used to connect the nodes 155 and 156 to ground terminals 159 and 160 during comparison operation.

The capacitors 106 and 107, each with the capacity value of 8C, are an analog input side level-adjusting comparator and a reference side level-adjusting comparator, respectively. The one end of each of the level-adjusting capacitors 106 and 107 is connected to a selector 128 or 129, respectively. In response to the control signal 134 from the successive approximation control circuit 105, the one end of the capacitor 106 is connected to either a power source terminal 140 or a ground terminal 138, and the one end of the capacitor 107 is also connected either a power source terminal 141 or a ground terminal 139.

Switches 130 and 131 connect a common electrodes 132 of the analog input side capacitor array 102 and a common electrode 133 of the reference side capacitor array 103 to the ground terminals 138 and 139, respectively, when sampling the analog input voltage.

Figure 2:
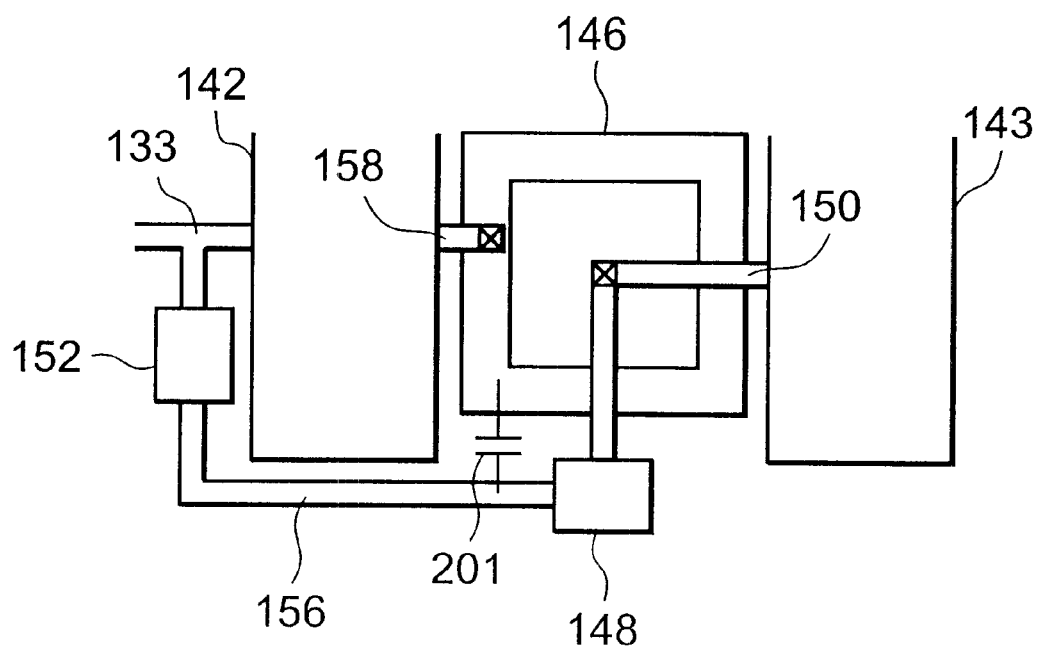
FIG. 2 is a schematic diagram of the comparator shown in FIG. 1.

FIG. 2 schematically shows an example of the layout of the comparator 104, which includes the pre-amplifier 142, an output-stage amplifier 143, an offset-canceling capacitor 146, and offset-canceling switches 148 and 152.

Next, the AD conversion operation of the AD converter shown in FIG. 1 will be described.

First, in the charge clear mode, the switches 130 and 131 are turned on. The common electrode 132 of the analog input side capacitor array 102 and the common electrode 133 of the reference side capacitor array 103 are connected to the ground potential GND, the capacitors 108–112 are connected to the ground potential GND via the selectors 119–122, the capacitors 113–117 are connected to the ground potential GND via the selectors 123–127, and the level-adjusting capacitors 106 and 107 are connected to the ground potential GND via the selectors 128 and. 129.

The offset canceling switches 147, 148, 151, and 152 are turned on, and the switches 153 and 154 are turned off. In this mode, the extra charge accumulated in all the capacitors and nodes are cleared.

Next, in the offset canceling mode, the switches 130 and 131 are turned off, and the level-adjusting capacitors 106 and 107 are connected to the power source potential VDD by the selectors 128 and 129. In this mode, the potential of the common electrode 132 of the analog input side capacitor array 102, the common electrode 133 of the reference side capacitor array 103, and inputs 149 and 150 of the output-stage amplifier 143 is the capacity-voltage division potential. If the total of the capacity values of the capacitor arrays 102 and 103 and level-adjusting capacitors 106 and 107 is larger than the total of the parasitic capacity produced in the offset-canceling capacitors 145 and 146 and in the inputs 149 and 150 to the output-stage amplifier, the potential is about ⅓×VDD. In this case, the charge equivalent to the output offset when the input to the pre-amplifier 142 is about ⅓×VDD is accumulated in the offset-canceling capacitors 145 and 146. If the analog input side capacitor array 102, reference side capacitor array 103, and level-adjusting capacitors 106 and 107 vary in the capacity value due to a manufacturing problem, it is expected that there is a difference between about ⅓ VDD potential generated by the analog input side capacitor array 102 and that generated by the reference side capacitor array 103. However, in the AD converter shown in FIG. 1, the offset-canceling switches 147, 148, 151, and 152 are connected in series in two stages to cause a short across the nodes 155 and 156 provided between the switches. Therefore, the potential of the common electrodes 132 and that of the common electrode 133, both of which are input to the pre-amplifier 142, are always equal. And, the charge corresponding to the output offset of the pre-amplifier 142 is always accumulated in the offset-canceling capacitors 145 and 146. When the offset canceling mode is finished, the offset canceling switches 147, 148, 151, and 152 are turned off. After the offset canceling switches 147, 148, 151, and 152 are turned off, the switches 153 and 154 are turned on to fix the potential of the nodes 155 and 156, provided between the offset canceling switches 147, 148, 151, and 152, to the ground potential GND.

In the sampling mode, the switches 130 and 131 are turned on. Then, the common electrode 132 of the analog input side capacitor array 102 and the common electrode 133 of the reference side capacitor array 103 are connected to the ground potential GND. The capacitors 108–112 are connected to the analog input voltage VAIN by the selectors 118–122. The capacitors 113–117 are connected to the ground potential GND by the selectors 123–127. The level-adjusting capacitors 106 and 107 are connected to the ground potential GND by the selectors 128 and 129. At this time, the total charge Q1 accumulated in the analog input side capacitor array 102 is calculated as:

$$Q1 = 16C \times VAIN \tag{1}$$

The total charge Q2 accumulated in the reference side capacitor array 103 is calculated as:

$$Q2 = 0 \tag{2}$$

Next, when the mode is changed to the comparison mode, switches 130 and 131 are turned off. Then, the capacitors 108–111 are connected to the ground potential GND by selectors 118–121. The capacitor 112 is connected to the reference potential VR by the selector 122. The capacitors 113–117 are connected to the ground potential GND by the selectors 123–127. The level-adjusting capacitors 106 and 107 are connected to the power source potential VDD. At this time, let VCM1 be the potential of the common electrode 132. Then, the total charge Q3 accumulated in the analog input side capacitor array 102 is calculated as:

$$Q3 = 8C \times (VR - VCM1) + 8C \times (VDD - VCM1) - 8C \times VCM1 \quad (3)$$

Let VCM2 be the potential of the common electrode 133. Then, the total charge Q4 accumulated in the reference side capacitor array 103 is calculated as:

$$Q4 = 8C \times (VDD - VCM2) - 16C \times VCM2 \quad (4)$$

Here, $$Q1 = Q3 \quad (5)$$

$$Q2 = Q4 \quad (6)$$

by the law of charge conservation.

The following is obtained by substituting equations (1)–(4) into equations (5) and (6):

$$VCM1 = \tfrac{2}{3} \times (\tfrac{1}{2} \times VR - VAIN + \tfrac{1}{2} \times VDD) \quad (7)$$

$$VCM2 = \tfrac{1}{3} \times VS \quad (8)$$

The comparator 104 outputs the comparison result of "1" or "0" by comparing the potential VCM1 of the common electrode 132 represented by equation (7) with the potential VCM2 of the common electrode 133 represented by equation (8). As equations (7) and (8) show, when the analog input voltage VAIN equals the output voltage of the analog input side capacitor array (here, ½×VR), both the potentials VCM1 and VCM2 of the common electrodes become ⅓×VDD as if the mode was the offset cancel mode. The output offset of the pre-amplifier 142, generated when the potential of the common electrodes 132 and 133 which are the inputs to the pre-amplifier 142 is ⅓×VDD, is accumulated in the offset-canceling capacitors 145 and 146. Therefore, the potential of the inputs 149 and 150 to the output-stage amplifier 143 also become ⅓×VDD, and therefore the output offset of the pre-amplifier 142 may be ignored. The input offset of the output-stage amplifier 143 is reduced to a value generated by dividing it by the amplification ratio of the pre-amplifier 142. The successive approximation control circuit 105 determines the value of the most significant bit of the conversion result based on the output from the comparator 104, and supplies the control signal 134 to the selectors 118–122 to perform the comparison operation corresponding to the bit in the next place.

If the analog input voltage VAIN is higher than ½×VR, the comparator 104 outputs "1" to output the control signal 134 to connect the capacitor 111, corresponding to the bit in the next place, to the reference voltage VR while the capacitor 112, corresponding to the most-significant bit, is still connected to the reference voltage VR. That is, in the second comparison, the analog input voltage VAIN is compared with ¾×VR. Conversely, if the analog input voltage VAIN is lower than ½×VR, the comparator 104 outputs "0" to output the control signal 134 to connect the capacitor 112, corresponding to the most significant bit, to the ground potential GND and to connect the capacitor 111, corresponding to the bit in the next place, to the reference voltage VR. In the second comparison, the analog input voltage VAIN is compared with ¼×VR. In this way, by repeating the operation in which the successive approximation control circuit 105 outputs the successive approximation control signal 134 and then determines the bit value based on the output of the comparator 104 for a specified number of times (four times in this example), the analog input voltage VAIN is converted to digital output signals 135.

The layout diagram shown in FIG. 2 will be described.

In general, to reduce the production cost, a semiconductor integrated circuit is laid out as dense as possible to increase its integration. This is true of the AD converter shown in FIG. 1. To increase the integration, the pre-amplifier 142, output-stage amplifier 143, offset canceling capacitor 146, and offset canceling switches 148 and 152 are arranged close to each other, as shown in FIG. 2. When they are arranged as shown in FIG. 2, the bottom electrode of the offset canceling capacitor 146 connected to the output 158 of the pre-amplifier 142 is placed inevitably near the node 156 between the offset-canceling switches 148 and 152. In this state, there is a parasitic capacity 201 between the output 158 of the pre-amplifier 142 and the node 156 to such a degree that cannot be ignored and, this parasitic capacity 201 provides the feedback to the pre-amplifier 142 through the parasitic capacity 201. However, in the AD converter according to the present invention, because the node 156 between the offset canceling switches 148 and 152 is fixed to the ground potential GND by the switch 154 during comparison operation, no feedback is provided to the pre-amplifier 142 and therefore the comparator 104 can perform stable comparison operation.

Second Embodiment

In the first embodiment described above, the capacity value of the level-adjusting capacitor is the same as that of the most significant bit.

Let XC be the capacity value of the level-adjusting capacitor. Then, equations (3) and (7) are as follows:

$$Q3 = 8C \times (VR - VCM1) + XC \times (VDD - VCM1) - 8C \times VCM1 \quad (3)'$$

$$VCM1 = 16/(16+X) \times (\tfrac{1}{2} \times VR - VAIN + X/16 \times VDD) \quad (7)'$$

To perform the normal AD conversion operation, it is necessary that potential VCM1 of the common electrode represented by equation (7)' be within the power source voltage range (VDD ≧ VCM1). Therefore, it can be said that there is no limitation on the capacity value of the level-adjusting capacitor as long as it is equal to or larger than the capacity value of the most significant bit (8C or larger in the above example).

Third Embodiment

Next, the third embodiment according to the present invention will be described with reference to FIG. 3.

Figure 3:
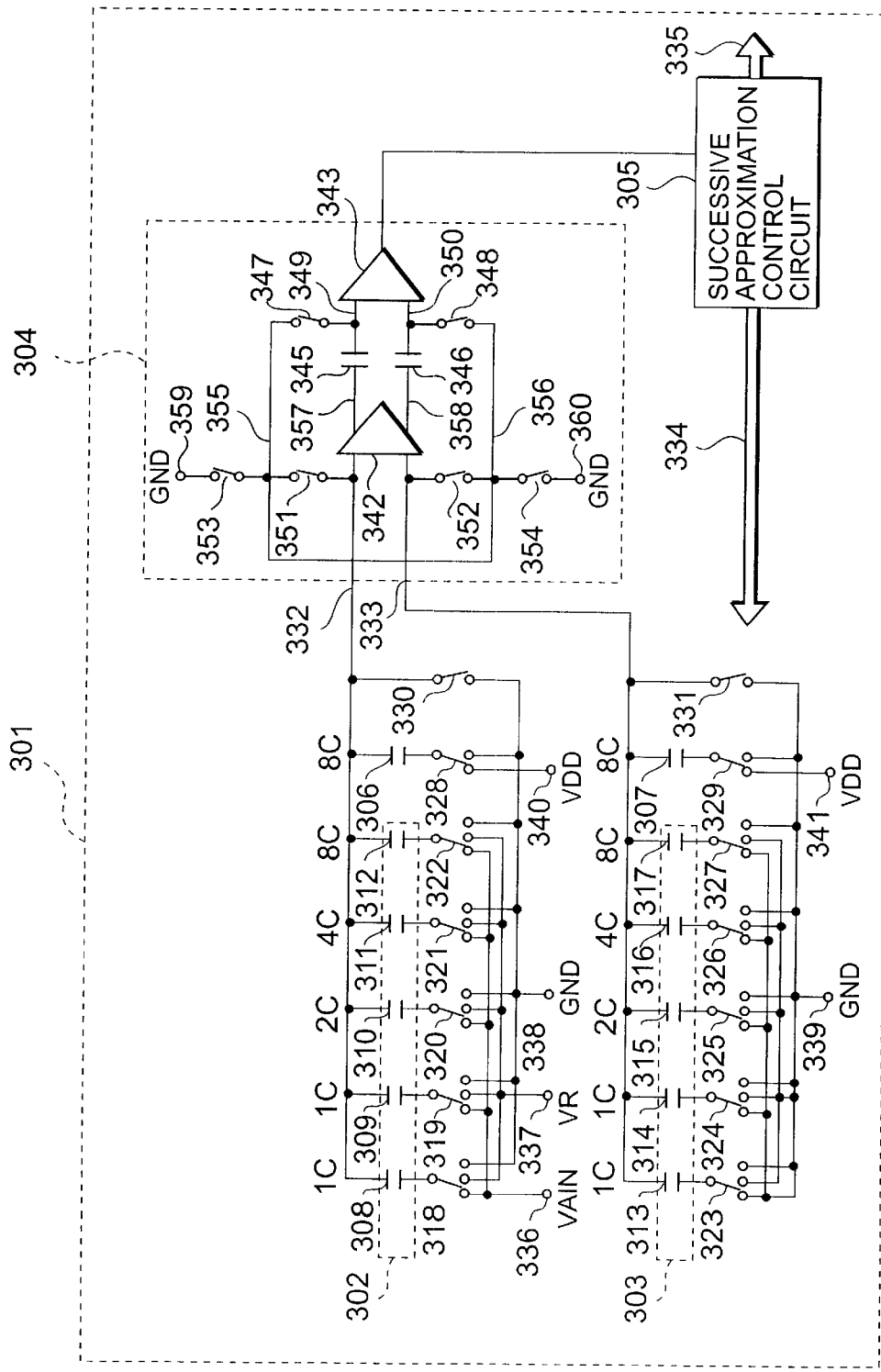
FIG. 3 is a circuit diagram of a second embodiment of the present invention.

FIG. 3 shows a 4-bit successive approximation AD converter used in the third embodiment of the present invention.

An AD converter 301 comprises an analog input side capacitor array 302, a reference side capacitor array 303, a comparator 304, a successive approximation control circuit 305, an analog input side level-adjusting capacitor 306, and a reference side level-adjusting capacitor 307.

The analog input side capacitor array 302 is an array composed of 4-bit-weighted capacitors 308, 309, 310, 311, and 312. That is, capacitors 308 and 309 are capacitors with the reference capacity value of C, the capacity 310 is a capacitor with the capacity value of 2C, the capacity 311 is a capacitor with the capacity value of 4C, and the capacity 312 is a capacitor with the capacity value of 8C. The one end of each of the above capacitors is connected to a selector 318, 319, 320, 321, or 322, respectively and, in response to a control signal 334 from the successive approximation control circuit 305, is connected to an analog input terminal 336, a reference power source terminal 337, or a ground terminal 338. The reference power terminal 337 is the terminal of the power that is used as the reference when the analog input voltage VAIN is converted to digital values. In general, the voltage of the reference power source is equal to or lower than the power source voltage.

The reference side capacitor array 303 is also an array composed of 4-bit-weighted capacitors 313, 314, 315, 316, and 317. That is, the capacitors 313 and 314 are capacitors with the reference capacity value of C, the capacity 315 is a capacitor with the capacity value of 2C, the capacity 316 is a capacitor with the capacity value of 4C, and the capacity 317 is a capacitor with the capacity value of 8C. The one end of each of the above capacitors is connected to a selector 323, 324, 325, 326, or 327, respectively and, in response to the control signal 334 from the successive approximation control circuit 305, is connected to a ground terminal 339 via the selectors 323, 324, 325, 326, and 327.

The comparator 304 comprises an output-stage amplifier 343 and a pre-amplifier 342 that reduces the offset of the output-stage amplifier 343. The output-stage amplifier 343 and the pre-amplifier 342 are connected via offset-canceling capacitors 345 and 346. Analog switch 347, 348, 351, and 352, provided for determining the operation point of the output-stage amplifier 343 and for canceling the offset of the pre-amplifier 342, are turned on during offset canceling. The node 355 between the analog switches 347 and 351 and the node 356 between the analog switches 348 and 352 are connected. These nodes are connected to switches 353 and 354 which are used to connect the nodes 355 and 356 to ground terminals 359 and 360 during comparison operation.

The capacitors 306 and 307, each with the capacity value of 8C, are an analog input side level-adjusting comparator and a reference side level-adjusting comparator, respectively. The one end of each of the level-adjusting capacitors 306 and 307 is connected to a selector 328 or 329, respectively. In response to the control signal 334 from the successive approximation control circuit 305, the capacitor 306 is connected to either a power source terminal 340 or a ground terminal 338, and the capacitor 307 is connected either a power source terminal 341 or a ground terminal 339.

Switches 330 and 331 connect a common electrodes 332 of the analog input side capacitor array 302 and a common electrode 333 of the reference side capacitor array 303 to the ground terminals 340 and 341, respectively, when sampling the analog input voltage.

Next, the AD conversion operation of the AD converter shown in FIG. 3 will be described.

First, in the charge clear mode, the switches 330 and 331 are turned on. The common electrode 332 of the analog input side capacitor array 302 and the common electrode 333 of the reference side capacitor array 303 are connected to the power source potential VDD, the capacitors 308–312 are connected to the power source potential VDD via the selectors 319–322, the capacitors 313–317 are connected to the power source potential VDD via the selectors 323–327, and the level-adjusting capacitors 306 and 307 are connected to the power source potential VDD via the selectors 328 and 329. Also, the offset canceling switches 347, 348, 351, and 352 are turned on, and the switches 353 and 354 are turned off. In this modes the extra charge accumulated in all the capacitors and nodes are cleared.

Next, in the offset canceling mode, the switches 330 and 331 are turned off, and the level-adjusting capacitors 306 and 307 are connected to the ground potential GND by the selectors 328 and 329. In this mode, the potential of the common electrode 332 of the analog input side capacitor array 302, the common electrode 333 of the reference side capacitor array 303, and inputs 349 and 350 to the output-stage amplifier 343 is the capacity-voltage division potential. If the total of the capacity values of the capacitor arrays 302 and 303 and level-adjusting capacitors 306 and 307 is larger than the total of the parasitic capacity produced in the offset-canceling capacitors 345 and 346 and in the inputs 349 and 350 to the output-stage amplifier, the potential is about $2/3 \times VDD$. In this case, the charge equivalent to the output offset when the input to the pre-amplifier 342 is about $2/3 \times VDD$ is accumulated in the offset-canceling capacitors 345 and 346. If the analog input side capacitor array 302, reference side capacitor array 303, and level-adjusting capacitors 306 and 307 vary in the capacity value due to a manufacturing problem, it is expected that there is a difference between about $1/3 \times VDD$ generated by the analog input side capacitor array 302 and that generated by the reference side capacitor array 303. However, in the AD converter shown in FIG. 3, the offset-canceling switches 347, 348, 351, and 352 are connected in series in two stages to cause a short across the nodes 355 and 356 provided between the switches. Therefore, the potential of the common electrodes 332 and that of the common electrode 333, both of which are input to the pre-amplifier 342, are always equal. And, the charge corresponding to the output offset of the pre-amplifier 342 is always accumulated in the offset-canceling capacitors 345 and 346. When the offset canceling mode is finished, the offset canceling switches 347, 348, 351, and 352 are turned off. After the offset canceling switches 347, 348, 351, and 352 are turned off, the switches 353 and 354 are turned on to fix the potential of the nodes 355 and 356, provided between the offset canceling switches 347, 348, 351, and 352, to the ground potential GND.

Next, in the sampling mode, the switches 330 and 331 are turned on. Then, the common electrode 332 of the analog input side capacitor array 302 and the common electrode 333 of the reference side capacitor array 303 are connected to the power source potential VDD. The capacitors 308–312 are connected to the analog input voltage VAIN by the selectors 318–322. The capacitors 313–317 are connected to the reference potential VR by the selectors 323–327. The level-adjusting capacitors 306 and 307 are connected to the power source potential VDD by the selectors 328 and 329.

At this time, the total charge Q5 accumulated in the analog input side capacitor array 302 is calculated as:

$$Q5 = 16C \times (VAIN - VDD) \qquad (9)$$

The total charge Q6 accumulated in the reference side capacitor array 303 is calculated as:

$$Q6 = 16C \times (VR - VDD) \qquad (10)$$

Next, when the mode is changed to the comparison mode, switches 330 and 331 are turned off. Then, the capacitors 308–311 are connected to the ground potential GND by selectors 318–321. The capacitor 312 is connected to the reference potential VR by the selector 322. The capacitors 313–317 are connected to the reference voltage VR by the selectors 323–327. The level-adjusting capacitors 306 and 307 are connected to the ground potential GND.

At this time, let VCM1 be the potential of the common electrode 332. Then, the total charge Q7 accumulated in the analog input side capacitor array 302 is calculated as:

$$Q7 = 8C \times (VR - VCM1) - 8C \times VCM1 - 8C \times VCM1 \quad (11)$$

Let VCM2 be the potential of the common electrode 333. Then, the total charge Q8 accumulated in the reference side capacitor array 303 is calculated as:

$$Q8 = 16C \times (VR - VCM2) - 8C \times VCM2 \quad (12)$$

Here, $$Q5 = Q7 \quad (13)$$

$$Q6 = Q8 \quad (14)$$

by the law of charge conservation.

The following is obtained by substituting equations (9)–(12) into equations (13) and (14):

$$VCM1 = \tfrac{2}{3} \times (\tfrac{1}{2} \times VR - VAIN + VDD) \quad (15)$$

$$VCM2 = \tfrac{2}{3} \times VDD \quad (16)$$

The comparator 304 outputs the comparison result of "1" or "0" by comparing the potential VCM1 of the common electrode 332 represented by equation (15) with the potential VCM2 of the common electrode 333 represented by equation (16). As equations (15) and (16) show, when the analog input voltage VAIN equals the output voltage of the analog input side capacitor array (here, ½×VR), both the potentials VCM1 and VCM2 of the common electrodes become ⅔×VDD as if the mode was the offset cancel mode. The output offset of the pre-amplifier 342, generated when the potential of the common electrodes 332 and 333 which are the inputs to the pre-amplifier 342 is ⅔×VDD, is accumulated in the offset-canceling capacitors 345 and 346. Therefore, the potential of the inputs 349 and 350 to the output-stage amplifier 343 also become ⅔×VDD, and therefore the output offset of the pre-amplifier 342 may be ignored. The input offset of the output-stage amplifier 343 is reduced to a value generated by dividing it by the amplification ratio of the pre-amplifier 342. The successive approximation control circuit 305 determines the value of the most significant bit of the conversion result based on the output from the comparator 304, and supplies the control signal 334 to the selectors 318–322 to perform the comparison operation corresponding to the bit in the next place.

If the analog input voltage VAIN is higher than ½×VR, the comparator 304 outputs "1" to output the control signal 334 to connect the capacitor 311, corresponding to the bit in the next place, to the reference voltage VR while the capacitor 312, corresponding to the most-significant bit, is still connected to the reference voltage VR. That is, in the second comparison, the analog input voltage VAIN is compared with ¾×VR. Conversely, if the analog input voltage VAIN is lower than ½×VR, the comparator 304 outputs "0" to output the control signal 334 to connect the capacitor 312, corresponding to the most significant bit, to the ground potential GND and to connect the capacitor 311, corresponding to the bit in the next place, to the reference voltage VR. In the second comparison, the analog input voltage VAIN is compared with ¼×VR. In this way, by repeating the operation in which the successive approximation control circuit 305 outputs the successive approximation control signal 334 and then determines the bit value based on the output of the comparator 304 for a specified number of times (four times in this example), the analog input voltage VAIN is converted to digital output signals 335.

Fourth Embodiment

Next, a fourth embodiment according to the present invention will be described.

Figure 4:
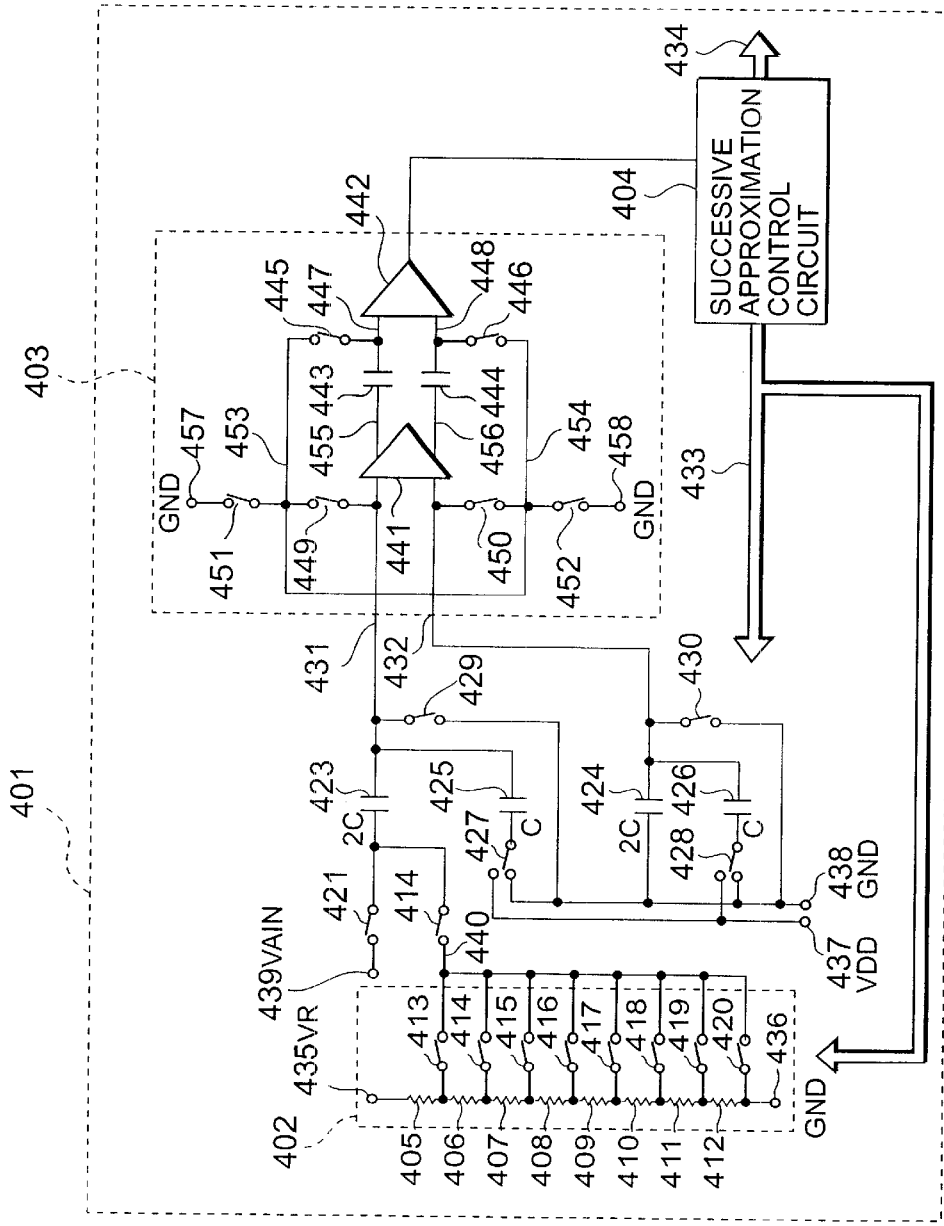
FIG. 4 is a circuit diagram of a third embodiment of the present invention.
Figure 5:
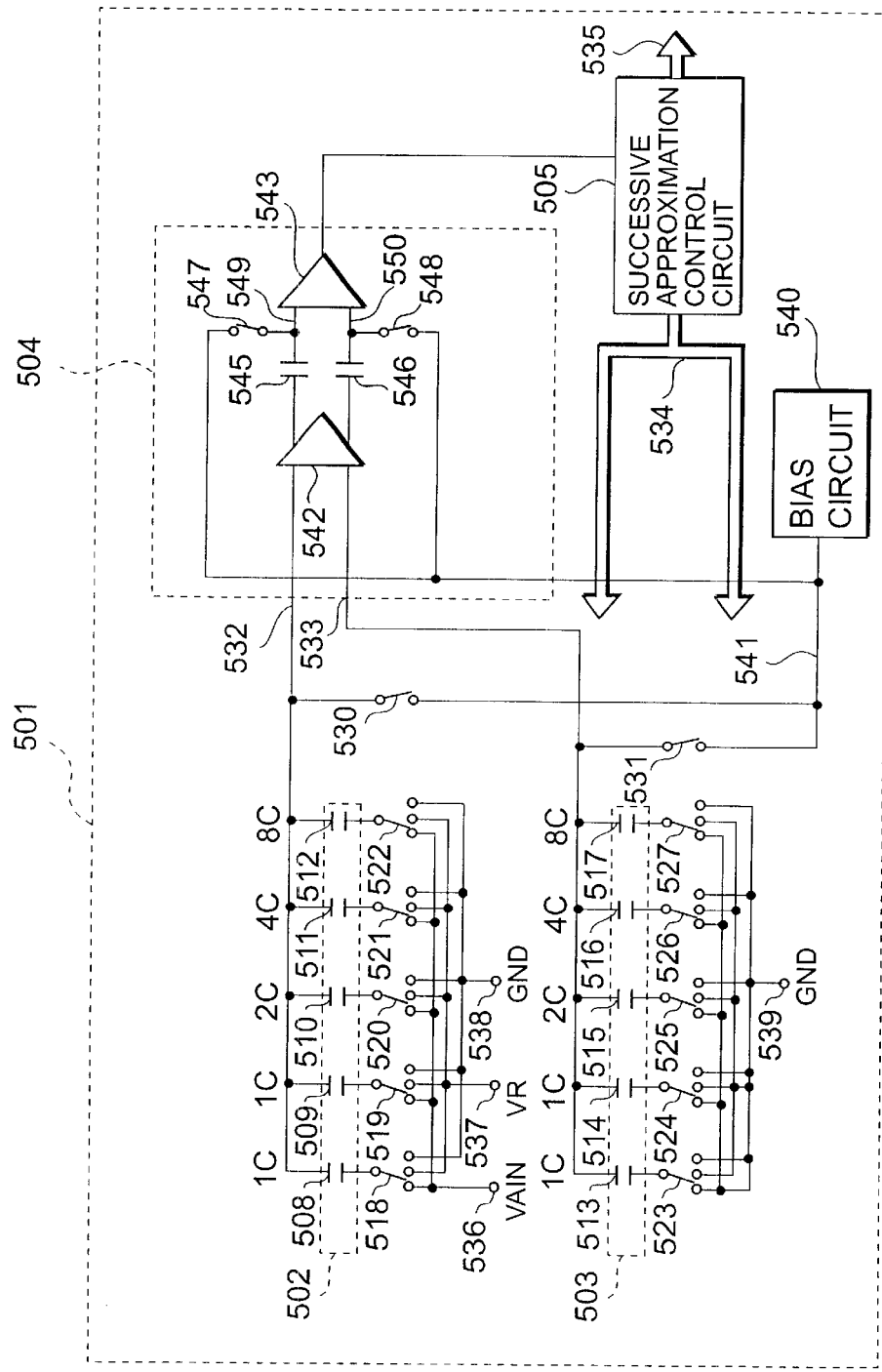
FIG. 5 is a circuit diagram of a conventional AD converter.
Figure 6:
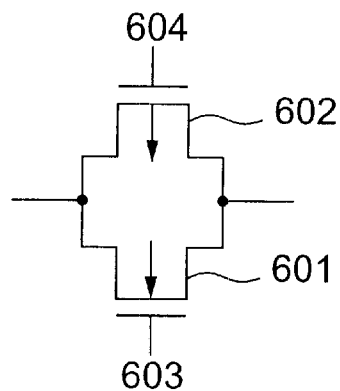
FIG. 6 is a circuit diagram of an analog switch.
Figure 7:
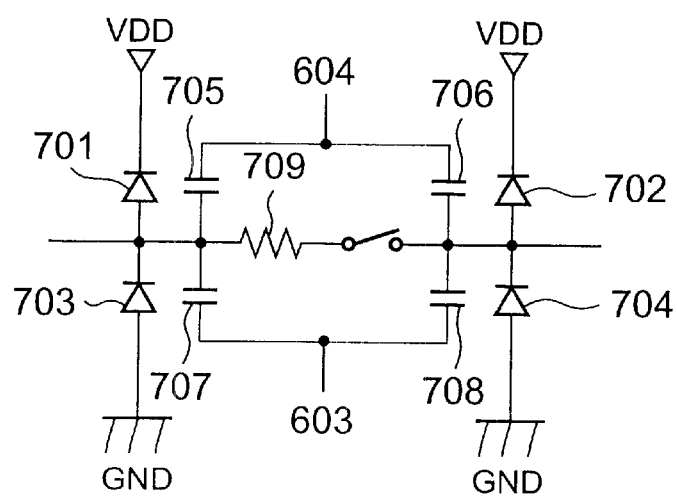
FIG. 7 is an equivalent circuit diagram of the analog switch shown in FIG. 6.
Figure 8A:
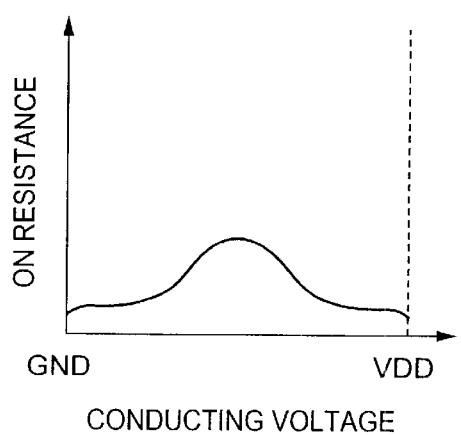
FIGS. 8(a) and 8(b) are graphs showing the state of the ON resistance of the analog switch shown in FIG. 6.
Figure 8B:
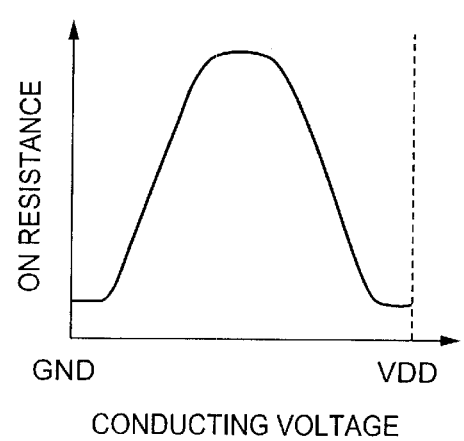
Figure 9:
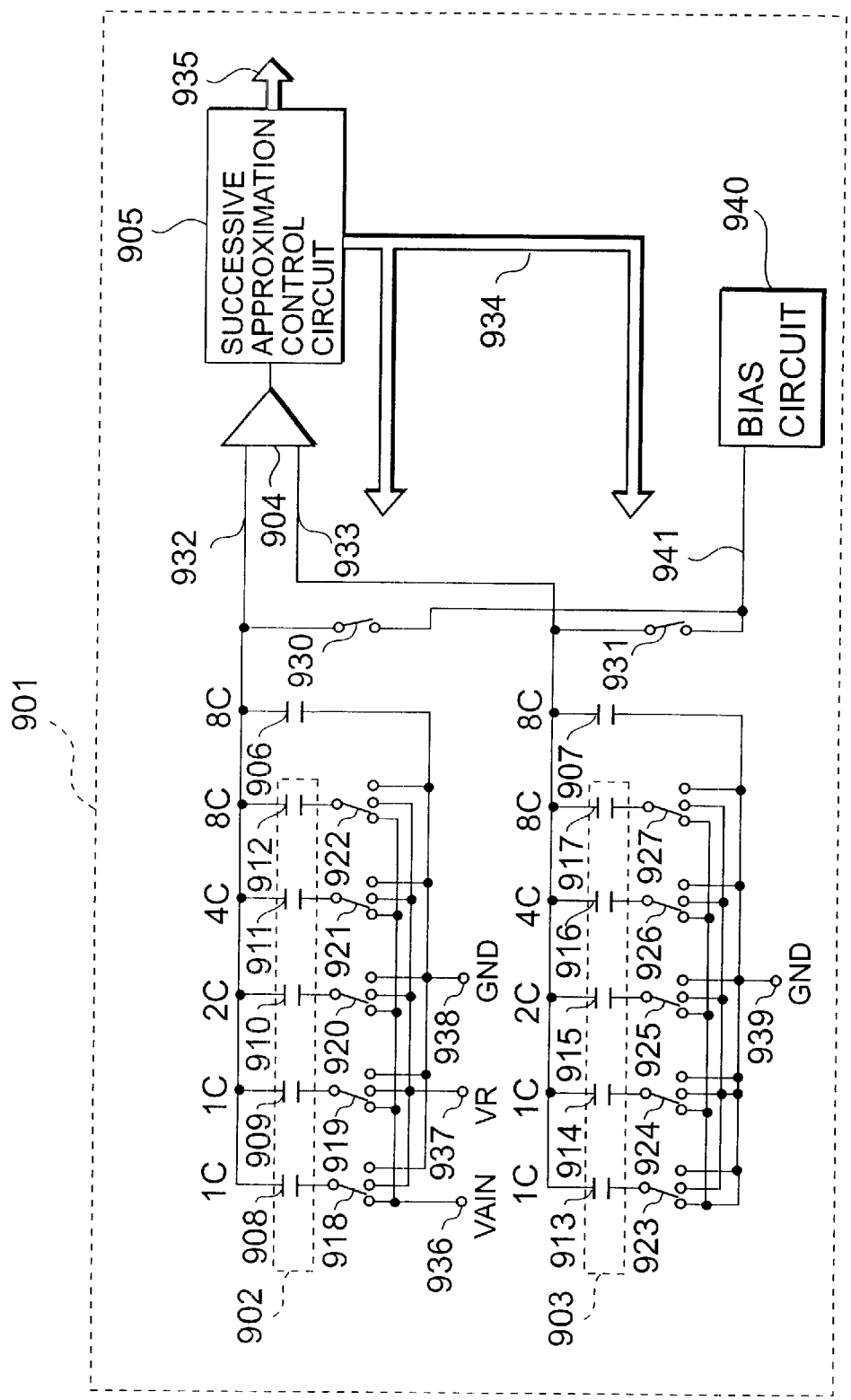
FIG. 9 is a circuit diagram showing another conventional AD converter.
Figure 10:
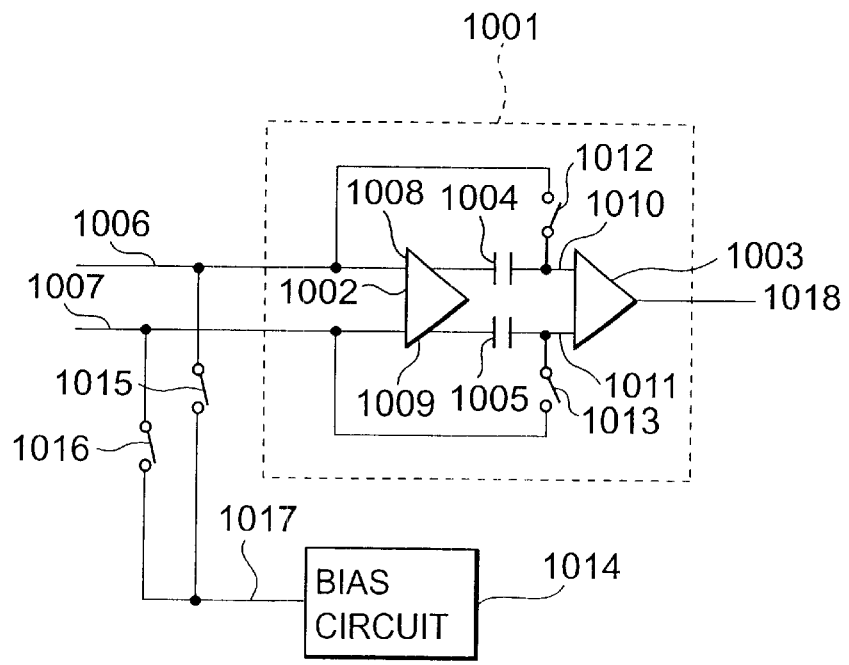
FIG. 10 is a circuit diagram of the comparator shown in FIG. 9.
Figure 11:
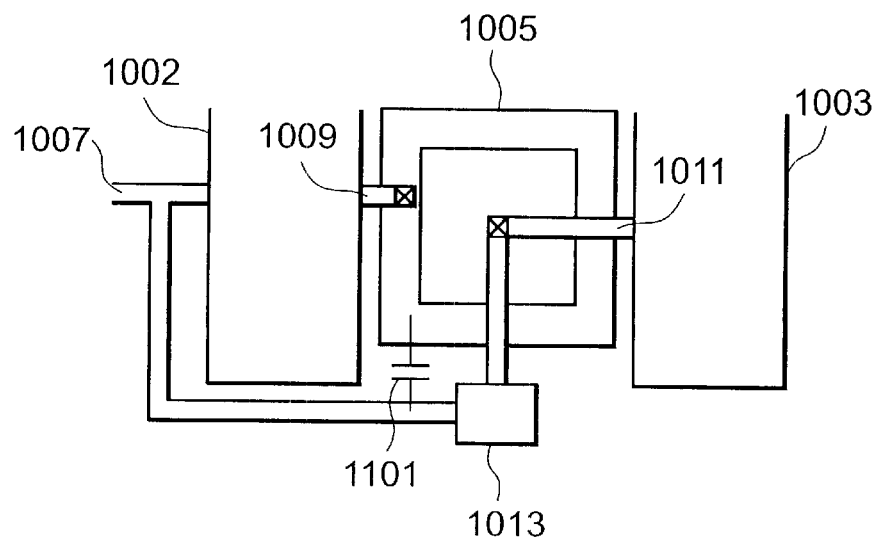
FIG. 11 is a schematic diagram of the layout of the comparator shown in FIG. 10.

FIG. 4 is a circuit diagram showing an example of a 3-bit successive approximation AD converter which has a resistor string in the reference DA converter.

An AD converter 401 comprises a resistor string 402, an analog input side sampling capacitor 423, a reference side sampling capacitor 424, a comparator 403, a successive approximation control circuit 404, an analog input side level-adjusting capacitor 425, and a reference side level-adjusting capacitor 426.

An capacitor 423 is a capacitor with the capacity value of 2C. The one end of this capacitor is connected to analog switches 421 and 422 and, in response to a control signal 433 from the successive approximation control circuit 404, either to an analog input terminal 439 or to the output 440 of the resistor string. The other end 431 of the capacitor 423 is connected to the comparator 403. The capacitor 424 is a capacitor with the capacity value of 2C. The one end of this capacitor is connected to a ground terminal 438, and the other end 432 to the comparator 403.

The resistor string 402 comprises eight reference resistors 405, 406, 407, 408, 409, 410, 411, and 412 connected in series between a reference power-source terminal 435 and a ground terminal 436 and analog switches 413, 414, 415, 416, 417, 418, 419, and 420 which obtain voltages divided by the reference resistors 405–412. In response to the control signal 433 from the successive approximation control circuit 404, one of the analog switches 413–420 is selected and turned on to output the resistor division intermediate potential to the output 440. The analog switches 421 and 422 are connected to the analog input voltage VAIN in the sampling mode. In the comparison mode, these switches are used to connect the potential 440, selected from the resistor string 402 in response to the control signal 433 from the successive approximation control circuit 404, to the analog input side sampling capacitor 423.

The comparator 403 comprises an output-stage amplifier 442 and a pre-amplifier 441 that reduces the offset of the output-stage amplifier 442. The output-stage amplifier 442 and the pre-amplifier 441 are connected via offset-canceling capacitors 443 and 444. Analog switch 445, 446, 449, and 450, provided for determining the operation point of the output-stage amplifier 442 and for canceling the offset of the pre-amplifier 441, are turned on during offset canceling.

The node 453 between the analog switches 445 and 449 and the node 454 between the analog switches 446 and 450 are shorted. These nodes are connected to switches 451 and 452 which are used to connect the nodes 453 and 454 to ground terminals 457 and 458 during comparison operation.

The capacitors 425 and 426, each with the capacity value of C, are an analog input side level-adjusting comparator and a reference side level-adjusting comparator, respectively. The one end of each of the capacitors 425 and 426 is connected to a selector 427 or 428, with the other end to the electrode 431 or the electrode 432, respectively. In response to the control signal 433 from the successive approximation control circuit 404, the capacitors are connected to either a power source terminal 437 or a ground terminal 438.

Switches 429 and 430 are switches used to connect the comparator side electrode 431 of the analog input side capacitor 423 and the comparator side electrode 432 of the reference side capacitor 424 to the ground terminal 438 when sampling the analog input voltage.

Next, the AD conversion operation of the AD converter shown in FIG. 4 will be described.

First, in the charge clear mode, the switches 429 and 430 are turned on. The comparator side electrode 431 of the analog input side sampling capacitor 423 and the comparator side electrode 432 of the reference side sampling capacitor 424 are connected to the ground potential GND, the other end of the analog input side sampling capacitor 423 is connected to the ground potential GND by the switches 420 and 422, and the level-adjusting capacitors 425 and 426 are connected to the ground potential GND by the selectors 427 and 428. In addition, the offset canceling switches 445, 446, 449, and 450 are turned on. In this mode, the extra charge accumulated in all the capacitors and contacts are cleared.

Next, in the offset canceling mode, the switches 429 and 430 are turned off, and the level-adjusting capacitors 425 and 426 are connected to the power source potential VDD by the selectors 427 and 428. In this mode, the potential of the comparator side electrode 431 of the analog input side sampling capacitor 423, the comparator side electrode 432 of the reference side sampling capacitor 424, and inputs 447 and 448 to the output-stage amplifier 442 is the capacity-voltage division potential. If the total of the capacity values of the sampling capacitors 423 and 424 and level-adjusting capacitors 425 and 426 is much larger than the total of the parasitic capacity produced in the offset-canceling capacitors 443 and 444 and in the inputs 447 and 448 to the output-stage amplifier, the potential is about ⅓×VDD. In this case, the charge equivalent to the output offset when the input to the pre-amplifier 441 is about ⅓×VDD is accumulated in the offset-canceling capacitors 443 and 444. If the analog input side sampling capacitor 423, reference side sampling capacitor 424, and level-adjusting capacitors 425 and 426 vary in the capacity value due to a manufacturing problem, it is expected that there is a difference between about ⅓×VDD generated by the analog input side sampling capacitor 423 and that generated by the reference side sampling capacitor 424. However, in the AD converter shown in FIG. 4, the offset-canceling switches 445, 446, 449, and 450 are connected in series in two stages to cause a short across the nodes 453 and 454 provided between the switches. Therefore, the potential of the input 431 to the pre-amplifier 441 and the potential of the input 432 to the pre-amplifier 441 are always equal. And, the charge corresponding to the output offset of the pre-amplifier 441 is always accumulated in the offset-canceling capacitors 443 and 444. When the offset canceling mode is finished, the offset canceling switches 445, 446, 449, and 450 are turned off. After the offset canceling switches 445, 446, 449, and 450 are turned off, the switches 451 and 452 are turned on to fix the potential of the nodes 453 and 454, provided between the offset canceling switches 445, 446, 449, and 450, to the ground potential GND.

Next, in the sampling mode, the switches 429 and 430 are turned on. Then, the comparator side electrode 431 of the analog input side sampling capacitor 423 and the comparator side electrode 432 of the reference side sampling capacitor 424 are connected to the ground potential GND. The sampling capacitor 423 is connected to the analog input voltage VAIN by the switch 421. The level-adjusting capacitors 425 and 426 are connected to the ground potential GND by the selectors 427 and 428. At this time, the total charge Q9 accumulated in the analog input side sampling capacitor 423 is calculated as:

$$Q9 = 2C \times VAIN \tag{17}$$

The total charge Q10 accumulated in the reference side sampling capacitor 424 is calculated as:

$$Q10 = 0 \tag{18}$$

Next, when the mode is changed to the comparison mode, switches 429 and 430 are turned off, the switch 421 is turned off, and the switch 422 is turned on. In the resistor string 402, only the switch 416 is turned on. The level-adjusting capacitors 425 and 426 are connected to the power source potential VDD by the selectors 427 and 428, respectively. At this time, let VCM1 be the potential of the comparator side electrode 431. Then, the total charge Q11 accumulated in the analog input side sampling capacitor 423 is calculated as:

$$Q11 = 2C \times (\tfrac{1}{2} \times VR - VCM1) + C \times (VDD - VCM1) \tag{19}$$

Let VCM2 be the potential of the comparator side electrode 432. Then, the total charge Q12 accumulated in the reference side sampling capacitor 424 is calculated as:

$$Q12 = 2C \times (-VCM2) + C \times (VDD - VCM2) \tag{12}$$

Here, $$Q9 = Q11 \tag{21}$$

$$Q10 = Q12 \tag{22}$$

by the law of charge conservation.

The following is obtained by substituting equations (17)–(20) into equations (21) and (22):

$$VCM1 = \tfrac{2}{3} \times (\tfrac{1}{2} \times VR - VAIN + \tfrac{1}{2} \times VDD) \tag{23}$$

$$VCM2 = \tfrac{1}{3} \times VDD \tag{24}$$

The comparator 403 outputs the comparison result of "1" or "0" by comparing the potential VCM1 of the comparator side electrode 431 represented by equation (23) with the potential VCM2 of the comparator side electrode 432 represented by equation (24). As equations (23) and (24) show, when the analog input voltage VAIN equals the output voltage of the resistor string (here, ½×VR), both the potentials VCM1 and VCM2 of the comparator side electrodes become ⅓×VDD as if the mode was the offset cancel mode.

The output offset of the pre-amplifier 441, generated when the potential of the comparator side electrodes 431 and 432 which are the inputs to the pre-amplifier 441 is ⅓×VDD, is accumulated in the offset-canceling capacitors 443 and 444. Therefore, the potential of the inputs 447 and 448 to the output-stage amplifier 442 also become ⅓×VDD, and therefore the output offset of the pre-amplifier 441 may be ignored. The input offset of the output-stage amplifier 442 is reduced to a value generated by dividing it by the amplification ratio of the pre-amplifier 441.

The successive approximation control circuit 404 determines the value of the most significant bit of the conversion result based on the output from the comparator 403 described above, and supplies the control signal 433 to the switches 413–420 to perform the comparison operation corresponding to the bit in the next place.

If the analog input voltage VAIN is higher than ½×VR, the comparator 403 outputs "1" to output the control signal 433 so that only the switch 414 is turned on. In the second comparison, the analog input voltage VAIN is compared with ¾×VR. Conversely, if the analog input voltage VAIN is lower than ½×VR, the comparator 403 outputs "0" to output the control signal 433 so that only the switch 418 is turned on. In the second comparison, the analog input voltage VAIN is compared with ¼×VR. In this way, by repeating the operation in which the successive approximation control circuit 404 outputs the successive approximation control signal 433 and then determines the bit value based on the output of the comparator 403 for a specified number of times (four times in this example), the analog input voltage VAIN is converted to digital output signals 434.

The AD converter, which is configured as described above, and its control method according to the present invention have the following effects:

The first effect is that, even when the reference power source voltage range (that is, the analog input voltage range) equals the power source range, the AD converter according to the present invention prevents a leak of the charge accumulated in the capacitor array caused by the potential of the common electrode exceeding the power voltage range and thus performs the AD conversion operation normally.

The reason is that level-adjusting capacitor arrays are added to the capacitor arrays. When the mode is changed from the sampling mode to the comparison mode, the connection of the level-adjusting capacitors is switched in order to prevent the common electrode potential from exceeding the power source voltage range.

The second effect is that, even when the power source voltage is low, the AD converter may be operated at a high speed.

The reason is that, if the power source voltage is low, the ON resistance of the MOS analog switch is very high when the intermediate potential, such as ½ of the power source voltage, conducts but that the ON resistance of is not so high when the power source potential or the ground potential conducts. In the AD converter according to the present invention, the potential of the common electrode is fixed to the power source potential (that is, power source potential or ground potential) in the sampling mode. This means that sampling may be performed when the ON resistance of the analog switch is low, thus making the sampling time shorter.

The third effect is that the power consumption of the AD converter is reduced.

The reason is that, because the potential of the common electrode is fixed to the power source potential in the sampling mode, there is no need for a bias circuit that would be required to generate the intermediate potential as it is when the potential is fixed to the intermediate potential. In addition, the circuit in which a plurality of amplifiers are connected via capacitors to reduce the offset of the comparator allows the intermediate potential, generated by capacity voltage division through the level-adjusting capacitors, to be used for accumulating the charge for the offset of the offset-canceling capacitors. This configuration also eliminates the need for the bias circuit.

The fourth effect is that the operation of the comparator is stable even when the components of the comparator are arranged close to each other to increase the integration density.

The reason is that, even when the pre-amplifier, output-stage amplifier, offset-canceling capacitors, and offset-canceling switches are arranged close to each other to increase the integration density, the switches for canceling the offset of the comparator are connected in series in two stages and the potential of the nodes between the switches connected in series are fixed to the ground potential during comparison operation. This configuration reduces the effect of the parasitic capacity generated between the output of the pre-amplifier connected to the offset-canceling capacitors and the input to the pre-amplifier connected to the offset-canceling switches, thus preventing the feedback to be provided to the pre-amplifier of the comparator.

The fifth effect is that the offset-canceling operation of the comparator is performed reliably without having to add a switch between two inputs of the comparator.

The reason is that, even when the analog input side capacitor array, reference side capacitor array, and level-adjusting capacitors vary in the capacity value due to a manufacturing problem and it is expected that there is a difference between the intermediate potentials of the two capacitor arrays, the offset-canceling switches are connected in series in two stages to cause a short across the nodes between the switches. Therefore, the potentials of the two inputs to the comparator are always equal.

What is claimed is:

1. An AD converter in which a first capacitor array is connected to one input of a comparator and a second capacitor array is connected to another input of the comparator and in which a charge proportional to an input analog signal level is accumulated in said first capacitor array, said AD converter comprising:

a level-adjusting capacitor whose one end is connected to said one input of the comparator to adjust a voltage of said one input of the comparator, to which said first capacitor array is connected, to a predetermined voltage; and switching means for switching a potential of another end of said capacitor to the potential that differs between a sampling mode and a comparison mode.

2. An AD converter in which, in an input signal sampling mode, a first reference capacitor in which a charge proportional to an input analog signal level is accumulated is connected to one input to a comparator and a second reference capacitor is connected to another input of said comparator and in which, in a comparison mode, a predetermined voltage is applied from a resistor array to said first reference capacitor, said AD converter comprising:

a level-adjusting capacitor whose one end is connected to said one input of the comparator to adjust a voltage of said one input of the comparator, to which said first reference capacitor is connected, to a predetermined voltage; and switching means for switching a potential of another end of said capacitor to the potential that differs between the sampling mode and the comparison mode.

3. The AD converter according to claim 1 wherein, in the input signal sampling mode, said switching means is switched to charge an potential of an input side of said comparator to a power source potential.

4. The AD converter according to claim 3 wherein said power source potential is a ground potential.

5. The AD converter according to claim 1 wherein said comparator comprises a plurality of amplifiers and capacitors connecting each two of said plurality of amplifiers, wherein at least two stages of switching elements are connected in series to make equal a bias potential of an amplifier in a first stage and the bias potential of each of the amplifiers in a second and following stages, and wherein, at least in the comparison mode, the potential of nodes between said switching elements connected in series is fixed to a predetermined potential.

6. The AD converter according to claim 5 wherein one of said switching elements makes the potential of said two inputs of the comparator equal to the bias potential of said plurality of amplifiers in the comparator.

7. The AD converter according to claim 1 wherein said switching means makes the potential of said another end of the capacitor a power source potential to make said one input of the comparator a predetermined potential and to cancel an offset of the comparator at the potential.

8. An AD converter control method in which a first capacitor array is connected to one input of a comparator and a second capacitor array is connected to another input of the comparator and in which a charge proportional to an input analog signal level is accumulated in said first capacitor array, said AD converter control method comprising the steps of:

providing a level-adjusting capacitor whose one end is connected to said one input of the comparator to adjust a voltage of said one input of the comparator, to which said first capacitor array is connected, to a predetermined voltage; and switching a potential of another end of said capacitor to the potential that differs between a sampling mode and a comparison mode.

9. An AD converter control method in which, in an input signal sampling mode, a first reference capacitor in which a charge proportional to an input analog signal level is accumulated is connected to one input to a comparator and a second reference capacitor is connected to another input of said comparator and in which, in a comparison mode, a predetermined voltage is applied from a resistor array to said first reference capacitor, said AD converter control method comprising the steps of:

providing a level-adjusting capacitor whose one end is connected to said one input of the comparator to adjust a voltage of said one input of the comparator, to which said first reference capacitor is connected, to a predetermined voltage; and switching the potential of another end of said capacitor to a potential that differs between the sampling mode and the comparison mode.

10. An AD converter control method according to claim 8 wherein an offset of said comparator is canceled at a voltage generated by said level-adjusting capacitor.

* * * * *